(12) United States Patent
Zhang et al.

(10) Patent No.: US 9,478,537 B2
(45) Date of Patent: Oct. 25, 2016

(54) HIGH-GAIN WIDE BANDGAP DARLINGTON TRANSISTORS AND RELATED METHODS OF FABRICATION

(75) Inventors: Qingchun Zhang, Cary, NC (US); Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 1759 days.

(21) Appl. No.: 12/503,386

(22) Filed: Jul. 15, 2009

(65) Prior Publication Data

US 2011/0012129 A1    Jan. 20, 2011

(51) Int. Cl.

| | |
|---|---|
| *H01L 29/24* | (2006.01) |
| *H01L 29/73* | (2006.01) |
| *H01L 21/331* | (2006.01) |
| *H01L 27/082* | (2006.01) |
| *H01L 21/82* | (2006.01) |
| *H01L 29/16* | (2006.01) |

(52) U.S. Cl.
CPC ....... *H01L 27/0825* (2013.01); *H01L 21/8213* (2013.01); *H01L 29/73* (2013.01); *H01L 29/1608* (2013.01)

(58) Field of Classification Search
CPC ...... H01L 29/24; H01L 29/73; H01L 21/331
USPC ......... 257/77, 567, 494, 495, 500, E29.104, 257/E29.174, E21.37; 438/364
See application file for complete search history.

(56) References Cited

U.S. PATENT DOCUMENTS

| | | | | |
|---|---|---|---|---|
| 3,758,831 A | * | 9/1973 | Clark .............................. | 257/497 |
| 4,058,825 A | * | 11/1977 | Bonis et al. .................. | 257/569 |
| 4,136,355 A | * | 1/1979 | Mizukoshi et al. .......... | 257/572 |
| 4,289,977 A | * | 9/1981 | Powers et al. .................. | 326/89 |
| 4,748,352 A | * | 5/1988 | Kamiya et al. ............... | 327/143 |
| 4,827,322 A | * | 5/1989 | Takata .......................... | 257/568 |
| 4,945,394 A | | 7/1990 | Palmour et al. | |

(Continued)

FOREIGN PATENT DOCUMENTS

| | | |
|---|---|---|
| JP | 60-240158 | 11/1985 |
| JP | 2000252295 A | 9/2000 |

(Continued)

OTHER PUBLICATIONS

Yi Tang, et al. "Hybrid All-SiC MOS-Gated Bipolar Transistor", Proceedings of the 14th International Symposium on Power Semiconductor Devices and ICs, 2002.*
Zhao et al. "1570, 14A 4H-SiC Bipolar Darlington with a High Current Gain of bate>462" www.scientific.net/MSF.457-460.1169. pdf 460.1169.pdf.*
Y. Tang et al. "Hybrid All-SiC MOS-Gated Bipolar Transistor (MGT)" IEEE 2002, 53-56.*
"Principles of Semiconductor Devices" Chap. 5: Bipolar Junction Transistors, ecee.colorado.edu.*

(Continued)

*Primary Examiner* — Sheng Zhu
(74) *Attorney, Agent, or Firm* — Myers Bigel & Sibley, P.A.

(57) ABSTRACT

A packaged power electronic device includes a wide bandgap bipolar driver transistor having a base, a collector, and an emitter terminal, and a wide bandgap bipolar output transistor having a base, a collector, and an emitter terminal. The collector terminal of the output transistor is coupled to the collector terminal of the driver transistor, and the base terminal of the output transistor is coupled to the emitter terminal of the driver transistor to provide a Darlington pair. An area of the output transistor is at least 3 times greater than an area of the driver transistor in plan view. For example, an area ratio of the output transistor to the driver transistor may be between about 3:1 to about 5:1. Related devices and methods of fabrication are also discussed.

26 Claims, 7 Drawing Sheets

(56) References Cited

U.S. PATENT DOCUMENTS

| | | | |
|---|---|---|---|
| 5,027,182 A * | 6/1991 | Kim et al. | 257/570 |
| 5,530,612 A * | 6/1996 | Maloney | 361/56 |
| 6,020,636 A * | 2/2000 | Adishian | 257/728 |
| 6,140,690 A * | 10/2000 | Oka et al. | 257/494 |
| 6,218,254 B1 | 4/2001 | Singh et al. | |
| 6,242,967 B1 * | 6/2001 | Iwamuro et al. | 327/432 |
| 6,759,731 B2 * | 7/2004 | Chen | 257/592 |
| 7,045,877 B2 * | 5/2006 | Umemoto et al. | 257/567 |
| 8,115,211 B2 * | 2/2012 | Tarui | 257/77 |
| 2006/0138460 A1 * | 6/2006 | Sasaki et al. | 257/197 |
| 2006/0261876 A1 | 11/2006 | Agarwal et al. | |
| 2007/0241427 A1 * | 10/2007 | Mochizuki et al. | 257/586 |
| 2007/0279824 A1 * | 12/2007 | Mallikararjunaswamy | 361/118 |

FOREIGN PATENT DOCUMENTS

| | | |
|---|---|---|
| JP | 2008541275 A | 11/2008 |
| JP | 2009044083 A | 2/2009 |
| WO | WO 2004/079789 A2 | 9/2004 |
| WO | WO 2008/118271 A1 | 10/2008 |

OTHER PUBLICATIONS

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Zhang et al., "A 10-kV Monolithic Darlington Transistor with βforced of 336 in 4H-SiC" IEEE Electron Device Letters, vol. 30, No. 2, pp. 142-144, XP011240662.

Zhang et al., "A 10-kV Monolithic Darlington Transistor with βforced of 336 in 4H-SiC," *IEEE Electron Device Letters*, vol. 30, No. 2, 2/09.

International Preliminary Report on Patentability Corresponding to International Application No. PCT/US2010/042075; Date of Mailing: Jul. 28, 2011; 9 pages.

Office Action for corresponding JP application No. 2012-520767 with translation mailed Nov. 27, 2013 (3 pages).

\* cited by examiner

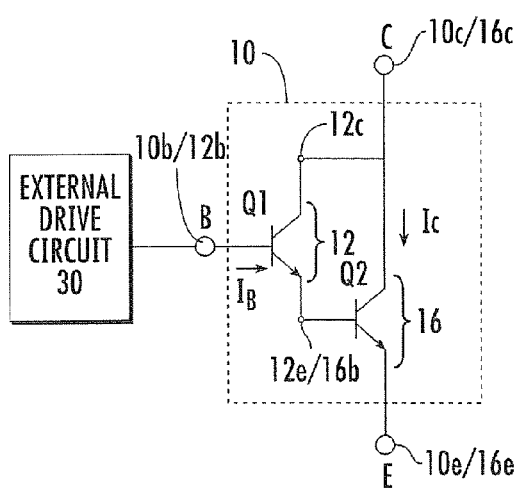
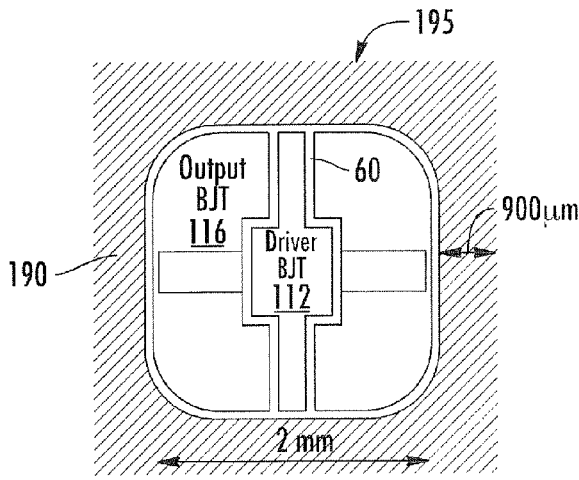
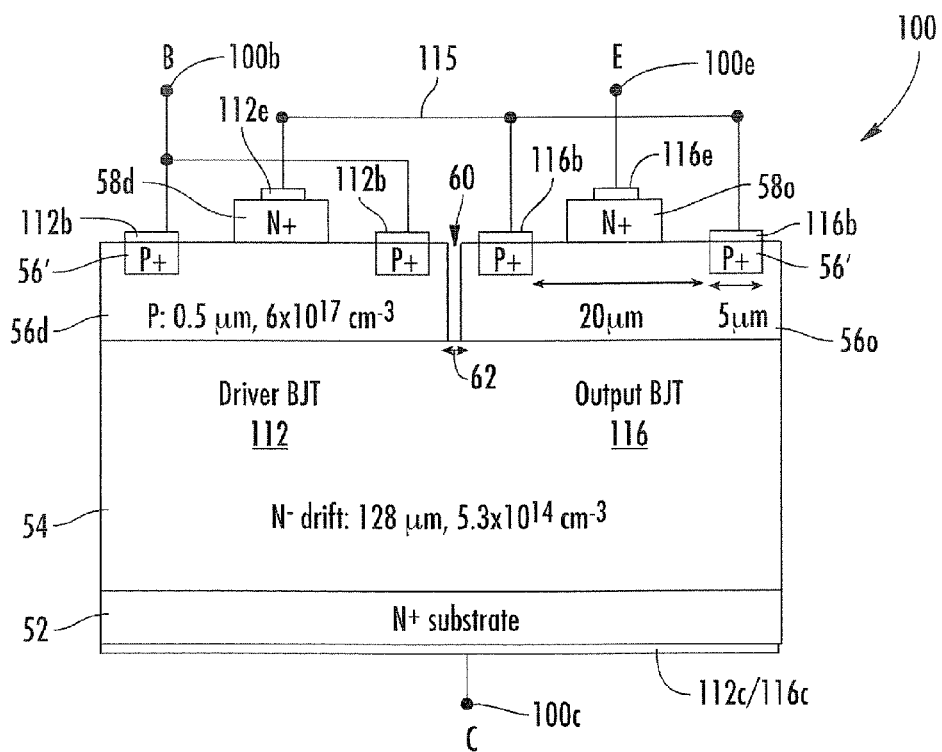
FIG. 1A
FIG. 1C
FIG. 1B

HIGH-GAIN WIDE BANDGAP DARLINGTON TRANSISTORS AND RELATED METHODS OF FABRICATION

STATEMENT OF GOVERNMENT INTEREST

The present invention was developed with Government support under Army Research Laboratory Contract No. W911NF-04-2-0021. The Government has certain rights in this invention.

FIELD

This invention relates to microelectronic devices, and more particularly, to power transistors and related fabrication methods.

BACKGROUND

Power devices are widely used to carry large currents and support high voltages. For example, circuits in motor drives, appliance controls, robotics, lighting ballasts and other applications often require semiconductor switching devices that can carry large currents and support high blocking voltages. One type of power device is the bipolar junction transistor (BJT). The bipolar junction transistor has been the switching device of choice for many high power applications because of its ability to handle relatively large current densities and support relatively high blocking voltages.

A BJT typically includes a semiconductor material having two opposing p-n junctions in close proximity to one another. Thus, BJTs may be referred to as "n-p-n" or "p-n-p" transistors. In operation, charge carriers enter a region of the semiconductor material of a first conductivity type adjacent one of the p-n junctions, which is called the emitter. Most of the charge carriers exit the device from a region of the semiconductor material of the first conductivity type adjacent the other p-n junction, which is called the collector. A third region of the semiconductor material, known as the base, is positioned between the collector and the emitter and has a conductivity type that is opposite the conductivity type of the collector and the emitter. The two p-n junctions of the BJT are formed where the collector meets the base and where the base meets the emitter.

BJTs are current controlled devices in that a BJT is turned "on" (i.e., it is biased so that current flows from the emitter to the collector) by flowing a current through the base of the transistor. When current is injected into or extracted from the base, depending upon whether the BJT is n-p-n or p-n-p, the flow of charge carriers, i.e., electrons or holes, which can move from the emitter to the collector, may be affected. By flowing a small current through the base of a BJT, a proportionally larger current passes from the emitter to the collector. Typically, a BJT may require a relatively large base current (e.g., one fifth to one tenth of the collector current) to maintain the device in its "on" state. As high power BJTs have large collector currents, they also typically have significant base current demands. Relatively complex external drive circuits may be required to supply the relatively large base currents that can be required by high power BJTs. These drive circuits are used to selectively provide a current to the base of the BJT that switches the transistor between its "on" and "off" states. Structural and operational details of BJTs are discussed in *Solid State Electronic Devices* by B. Streetman (2nd edition (1980), chapter 7).

The material that makes up a device can contribute to the operability and usefulness of the device. For example, conventional BJTs are typically formed of silicon (Si), but can also include gallium arsenide (GaAs) and indium phosphide (InP). Silicon carbide (SiC) has also been used as a material for BJTs. SiC has potentially advantageous semiconductor characteristics, for example, a wide bandgap, high electric field breakdown strength, high thermal conductivity, high melting point and high-saturated electron drift velocity. Thus, relative to devices formed in other semiconductor materials, for example, Si, electronic devices formed in SiC may have the capability of operating at higher temperatures, at high power densities, at higher speeds, at higher power levels and/or under high radiation densities. SiC BJTs are discussed, for example, in U.S. Pat. No. 4,945,394 to Palmour et al., and U.S. Pat. No. 6,218,254 to Singh et al.

Due to device properties such as relatively low on-resistance at relatively high current density, positive temperature coefficient (PTC) for the on-resistance, and/or relatively fast switching speeds, SiC power bipolar junction transistors (BJTs) may be desirable for use in high-power systems. SiC BJTs may have the potential to operate at high temperatures and/or relatively harsh environments, for example, due to the absence of a gate oxide. However, SiC BJTs typically require a continuous base drive current. Also, while SiC BJTs may provide a relatively high current gain, the open base breakdown voltage may be significantly reduced. The current gain of SiC BJTs may also be limited by recombination in the base, the base-emitter space charge region, and/or surface recombination.

SUMMARY

According to some embodiments of the present invention, a packaged electronic device includes a wide bandgap bipolar driver transistor having a base terminal, a collector terminal, and an emitter terminal, and a wide bandgap bipolar output transistor having a base terminal, a collector terminal, and an emitter terminal. The collector terminal of the output transistor is coupled to the collector terminal of the driver transistor, and the base terminal of the output transistor is coupled to the emitter terminal of the driver transistor to provide a Darlington pair. An area of the output transistor is at least about 3 times greater than an area of the driver transistor in plan view.

In some embodiments, an area ratio of the output transistor to the driver transistor may be between about 3:1 to about 5:1. For example, in some embodiments, the area ratio of the output transistor to the driver transistor may be about 5:1. A blocking voltage of the device may be greater than about 5 kilovolts (kV).

In some embodiments, the device may further include a wide bandgap bipolar avalanche transistor having a base terminal coupled to the base terminal of the output transistor, a collector terminal, a collector terminal coupled to the collector terminal of the output transistor, and an emitter terminal coupled to the emitter terminal of the output transistor.

In some embodiments, the packaged power electronic device may include a substrate of a first conductivity type. The substrate may include a common collector terminal thereon that provides the collector terminals of the driver and output transistors. A drift layer of the first conductivity type is provided on the substrate opposite the common collector terminal. The drift layer may have a lower carrier concentration than that of the substrate. A base layer of a second conductivity type opposite the first conductivity type is provided on the drift layer opposite the substrate. The base layer may include a trench therein that defines first and second electrically isolated mesas. The first mesa may include the base terminal of the driver transistor thereon, and the second mesa may include the base terminal of the output transistor thereon. An emitter layer of the first conductivity type is provided on the base layer opposite the drift layer. The emitter layer may include first and second electrically isolated portions. The first portion may include the emitter terminal of the driver transistor thereon, and the second portion may include the emitter terminal of the output transistor thereon.

In some embodiments, the trench may separate the first and second mesas of the base layer by a distance of about 4 µm or less to electrically isolate the driver transistor and the output transistor at voltages of about 10 kV or less.

In some embodiments, the trench may surround a periphery of the driver transistor. A junction termination extension region of the second conductivity type may surround a periphery of the output transistor.

In some embodiments, the drift layer may include a first region of the second conductivity type at a bottom of the trench adjacent the first mesa of the base layer, and a second region of the second conductivity type at the bottom of the trench adjacent the second mesa of the base layer.

In some embodiments, the trench may not extend completely through the base layer. A region of the first conductivity type may be provided in the base layer at a bottom of the trench between the first and second mesas. The region may have a dopant concentration that is sufficient to electrically isolate the driver transistor and the output transistor from one another.

In some embodiments, a region of the first conductivity type may be provided in the second mesa of the base layer adjacent to the base terminal of the output transistor. The region of the first conductivity type may be electrically connected to the emitter terminal of the output transistor on the second portion of the emitter layer. A portion of the base layer between the region of the first conductivity type therein and the drift layer may be thinner than a portion of the base layer between the second portion of the emitter layer and the drift layer to provide a non-destructive avalanche current path within an active area of the device.

In some embodiments, the driver and output transistors may be silicon carbide (SiC) devices, and the packaged power electronic device may have a current gain of greater than about 300 at room temperature. The current gain of the packaged power electronic device may increase as collector current density of the output transistor increases, and the current gain of the packaged power electronic device may decrease as operating temperature of the device increases.

In some embodiments, the driver transistor may be a second driver transistor, and the device may further include a first driver transistor having a base terminal, a collector terminal, and an emitter terminal. The emitter terminal of the first driver transistor may be coupled to the base terminal of the second driver transistor, and the collector terminal of the first driver transistor may be coupled to the collector terminals of the second driver transistor and the output transistor. The first driver transistor, the second driver transistor, and the output transistor may be silicon carbide (SiC) bipolar junction transistors, and the device may have a current gain of greater than about 10,000.

According to further embodiments of the present invention, a method of fabricating a packaged power electronic device includes providing a wide bandgap bipolar driver transistor having a base terminal, a collector terminal, and an emitter terminal on a substrate, and providing a wide bandgap bipolar output transistor having a base terminal, a collector terminal, and an emitter terminal on the substrate. The collector terminal of the output transistor is coupled to the collector terminal of the driver transistor, and the base terminal of the output transistor is coupled to the emitter terminal of the driver transistor to provide a Darlington pair. In plan view, an area of the output transistor is at least 3 times greater than an area of the driver transistor.

In some embodiments, an area ratio of the output transistor to the driver transistor may be between about 3:1 to about 5:1. For example, in some embodiments, the area ratio of the output transistor to the driver transistor may be about 5:1. A blocking voltage of the device may be greater than about 5 kilovolts (kV).

In some embodiments, the substrate may be of a first conductivity type, and may include a common collector terminal thereon that provides the collector terminals of the driver and output transistors. A drift layer of the first conductivity type may be provided on the substrate opposite the common collector terminal. The drift layer may have a lower carrier concentration than that of the substrate. A base layer of a second conductivity type opposite the first conductivity type may be provided on the drift layer opposite the substrate. The base layer may have a trench therein that defines first and second electrically isolated mesas. The first mesa may include the base terminal of the driver transistor thereon, and the second mesa may include the base terminal of the output transistor thereon. An emitter layer of the first conductivity type may be provided on the base layer opposite the drift layer. The emitter layer may include first and second electrically isolated portions. The first portion may include the emitter terminal of the driver transistor thereon, and the second portion may include the emitter terminal of the output transistor thereon.

In some embodiments, the substrate may be a 4H—SiC substrate cut at about 8 degrees off-axis. The drift layer, the base layer, and the emitter layer may be epitaxially grown on the substrate. The drift layer of the first conductivity type may be grown on the substrate, and the drift layer may have dopant concentration of about $5 \times 10^{14}$ cm$^{-3}$. The base layer of the second conductivity type may be grown on the drift layer, and the base layer may have a dopant concentration of about $6 \times 10^{17}$ cm$^{-3}$.

In some embodiments, the emitter terminals may be ohmic nickel contacts, and the base terminals may be ohmic aluminum/titanium contacts.

In some embodiments, the base layer may be formed on the drift layer, the emitter layer may be formed on the base layer opposite the drift layer, and the emitter layer may be etched to define the first and second electrically isolated portions thereof and to expose a portion of the base layer. The exposed portion of the base layer may be etched to provide the trench therein that defines the first and second electrically isolated mesas thereof.

In some embodiments, the trench may surround a periphery of the driver transistor. A junction termination extension region of the second conductivity type may be provided surrounding a periphery of the output transistor.

In some embodiments, a first region of the second conductivity type may be formed in the drift layer at a bottom of the trench adjacent the first mesa of the base layer, and a second region of the second conductivity type may be formed in the drift layer at the bottom of the trench adjacent the second mesa of the base layer.

In some embodiments, the trench may not extend completely through the base layer. A region of the first conductivity type may be formed in the base layer at a bottom of the trench between the first and second mesas. The region may have a dopant concentration that is sufficient to electrically isolate the driver transistor and the output transistor from one another.

In some embodiments, regions of the second conductivity type may be implanted into the first and second mesas of base layer at edges thereof. The implanted regions may have a greater dopant concentration than other regions of the base layer. The base terminal of the driver transistor may be provided on the implanted region of the first mesa, and the base terminal of the output transistor may be provided on the implanted region of the second mesa. A width of the implanted regions of the second conductivity type in the base layer may be less than about half of a width of the first or second portions of the emitter layer.

In some embodiments, a region of the first conductivity type may be formed in the second mesa of the base layer adjacent to the base terminal of the output transistor. The region of the first conductivity type may be electrically connected to the emitter terminal of the output transistor on the second portion of the emitter layer. A distance between the region of the first conductivity type and the drift layer may be less than a distance between the second portion of the emitter layer and the drift layer to provide a non-destructive avalanche current path within an active area of the device.

In some embodiments, the driver transistor may be a second driver transistor, and a first driver transistor having a base terminal, a collector terminal, and an emitter terminal may be provided on the substrate adjacent thereto. The emitter terminal of the first driver transistor may be coupled to the base terminal of the second driver transistor, and the collector terminal of the first driver transistor may be coupled to the collector terminals of the second driver transistor and the output transistor.

According to still further embodiments of the present invention, a wide bandgap Darlington transistor includes a first silicon carbide ("SiC") bipolar junction transistor ("BJT") having a collector, an emitter and a base, and a second SiC BJT having a collector that is coupled to the collector of the first SiC BJT and an emitter that is coupled to the base of the first SiC BJT and configured to provide a current thereto. An area ratio of the first SiC BJT to the second SiC BJT is between about 3:1 to about 5:1.

In some embodiments, the Darlington transistor may further include a third SiC BJT having a collector, an emitter, and a base connected to the collector, the emitter, and the base, respectively, of the first SiC BJT.

In some embodiments, the Darlington transistor may further include a third SiC BJT having a collector that is coupled to the collector of the first SiC BJT, an emitter that is coupled to a base of the second SiC BJT and configured to provide a current thereto, and a base that is configured to be coupled to an external drive circuit.

BRIEF DESCRIPTION OF THE DRAWINGS

FIG. 1A is a schematic circuit diagram illustrating a two-stage Darlington transistor according to some embodiments of the present invention.

FIG. 1B is a cross-sectional view illustrating a two-stage Darlington transistor unit cell according to some embodiments of the present invention.

FIG. 1C is a photographic image illustrating a Darlington transistor package according to some embodiments of the present invention in plan view.

DETAILED DESCRIPTION OF EMBODIMENTS

Figure 2:
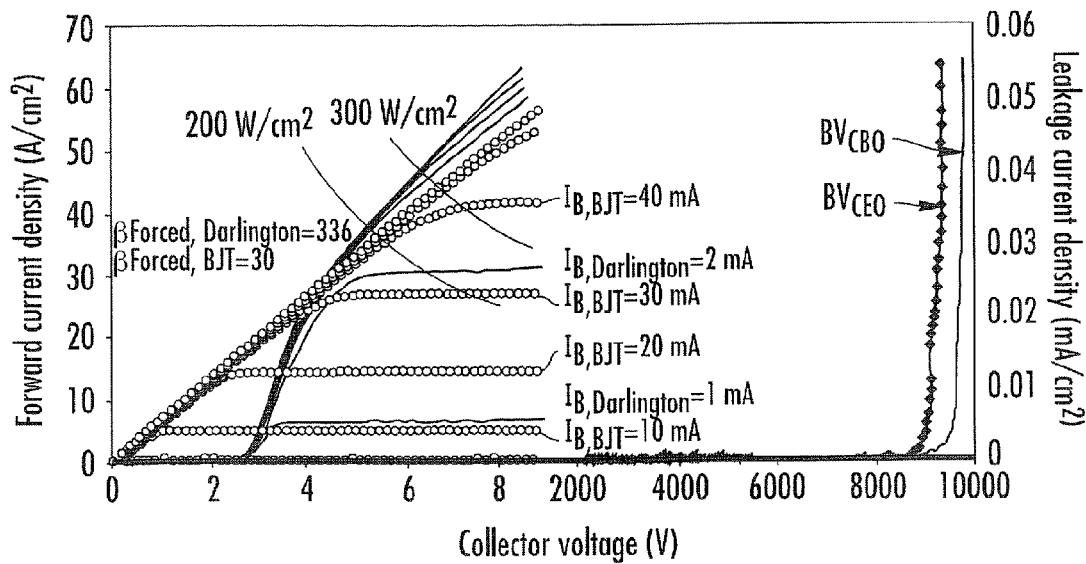
FIG. 2 is a graph illustrating output characteristics of a two-stage Darlington transistor according to some embodiments of the present invention as compared to a single BJT.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower" can therefore encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle may have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

Further improvement in the current gain of SiC BJTs can be achieved by utilizing two or more SiC BJTs connected to provide a Darlington pair, also referred to herein as a Darlington transistor. SiC Darlington transistors may provide a greater current gain, but with an increased forward voltage drop (for example, greater than about 2.7 V) as compared to a SiC BJT, which may make SiC Darlington transistors less attractive for low voltage applications (e.g., less than about 5 kV). However, for high voltage applications (for example, greater than about 5-10 kV) where transistors may typically be operated at higher forward voltages, the offset or increased forward voltage drop of a SiC Darlington transistor may be generally acceptable.

Accordingly, some embodiments of the present invention provide a 10 kV 4H—SiC bipolar Darlington transistor that has a forward voltage drop similar to that of a 10 kV SiC BJT, but with a higher forced current gain (for example, a current gain of about 336 in some embodiments) at room temperature. As such, the current gain of an SiC bipolar Darlington transistor according to some embodiments of the present invention may be more than 10 times higher than that of a 10 kV SiC BJT. The temperature dependence of the on-resistance and the current gain for Darlington transistors according to some embodiments of the present invention are also described in greater detail below.

FIG. 1A is a circuit diagram illustrating a wide bandgap two-stage Darlington transistor 10 according to some embodiments of the present invention. Such wide bandgap devices include an active semiconductor layer of a wide bandgap material, such as silicon carbide (SiC), gallium nitride (GaN), and/or other Group-III nitride material. As shown in FIG. 1A, a wide bandgap bipolar NPN transistor Q1 12 functions as the driver transistor, while a wide bandgap bipolar NPN output transistor Q2 16 is coupled to the driver transistor Q1 12 to form a Darlington transistor 10 having a base terminal 10b, a collector terminal 10c, and an emitter terminal 10e. In particular, a collector terminal 16c of the output transistor Q2 16 is coupled to the collector terminal 12c of the driver transistor Q1 12, and the base terminal 16b of the output transistor Q2 16 is coupled to the emitter terminal 12e of the driver transistor Q1 12 to provide a Darlington pair. The wide bandgap Darlington transistor 10 employs a cascade configuration where the driver transistor Q1 12 has a relatively small footprint, and the output transistor Q2 16 has relatively large footprint. As used herein, the "footprint" of a device refers to the area of the device in plan view, e.g., when the device is viewed from above at an angle normal to the semiconductor substrate. Such a configuration can be achieved by monolithic integration or hybrid combination of the transistors 12 and 16. The wide bandgap Darlington transistor 10 can be turned on with a reduced base current $I_B$ as compared to a single bipolar junction transistor (BJT), which may reduce power consumption of the external drive circuit 30.

FIG. 1B illustrates a cross-sectional view of a 10 kV SiC Darlington transistor unit cell 100 according to some embodiments of the present invention. FIG. 1C is a photograph illustrating a package including the 10 kV SiC Darlington transistor 100 of FIG. 1B in plan view. As shown in FIGS. 1B and 1C, a 10 kV SiC Darlington transistor unit cell 100 includes a relatively large SiC output BJT 116 that is driven by a relatively small SiC driver BJT 112. The output BJT 116 takes up the vast majority of the area of the device. The plan view area or footprint of the output BJT 116 may be approximately 3 to 5 times greater than that of the driver BJT 112, as discussed in greater detail below. In some embodiments, the plan view area of the output BJT 116 may be at least 3 times, 4 times, or 5 times greater than that of the driver BJT 112.

As shown in FIG. 1B, according to some embodiments of the present invention, the 10 kV SiC Darlington transistor 100 may be implemented as a monolithic structure that is formed on a bulk single crystal n-type 4H SiC substrate 52. The right-hand side of FIG. 1B illustrates a cross-sectional view of the output BJT 116, while the left-hand side of FIG. 1B illustrates a cross-sectional view of the driver BJT 112. Both BJTs 112 and 116 may have a cell pitch of 25 µm. The layers 54, 56, and 58 of the BJTs 112 and 116 may be grown on the n-type 4H—SiC substrate 52, and all of the layers may be grown in one epitaxial run. In some embodiments, the substrate 52 may be cut about 8 degrees off-axis prior to growth of the layers 54, 56, and/or 58 thereon. As used herein, the term "off-axis" refers to a tilt of the substrate surface relative to another surface or plane.

In particular, a layer of n-type conductivity SiC may be provided on the upper surface of the substrate 52 to form an n⁻ drift layer 54. The carrier concentration of the substrate 52 is higher than the carrier concentration of the n⁻ drift layer 54. Thus, the SiC substrate 52 may be referred to as an n⁺ substrate. The n-type drift layer 54 may be about 128 μm thick, and may have a dopant concentration of, for example, about $5.3 \times 10^{14}$ cm$^{-3}$. In contrast, the dopant concentration of the drift layer in conventional 10 kV devices may be on the order of about $5 \times 10^{15}$ cm$^{-3}$ or more. A p-type base layer 56 is provided on the n⁻ drift layer 54. The p-type base layer 56 may be, for example, epitaxially grown following the growth of the n⁻ drift layer 54, and may comprise a p-type conductivity SiC layer having a thickness of about 0.5 μm. The p-type base layer 56 may be doped to a concentration of, for example, about $6 \times 10^{17}$ cm$^{-3}$, and may include p⁺ regions 56' therein having a higher dopant concentration for the base contact. An n⁺ SiC emitter layer 58 is provided on the p-type base layer 56. The n⁺ emitter layer 58 may be about 2 μm thick, and may be heavily doped with, for example, nitrogen. With regard to the carrier concentrations, the p⁺ and n⁺ conductivity type regions and epitaxial layers described above may be as heavily doped as possible without causing excessive fabrication defects. Suitable dopants for producing the p-type regions include aluminum, boron or gallium. Suitable dopants for producing the n-type regions include nitrogen and phosphorus.

Figure 5:
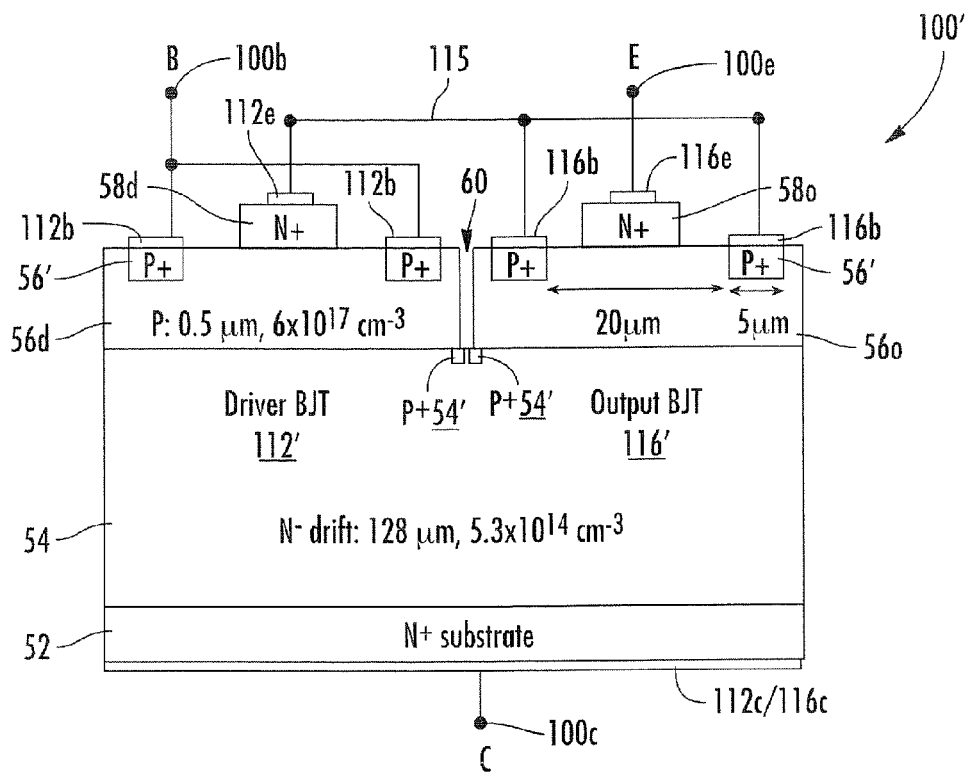
FIG. 5 is a cross-sectional view illustrating a two-stage Darlington transistor unit cell according to further embodiments of the present invention.
Figure 6:
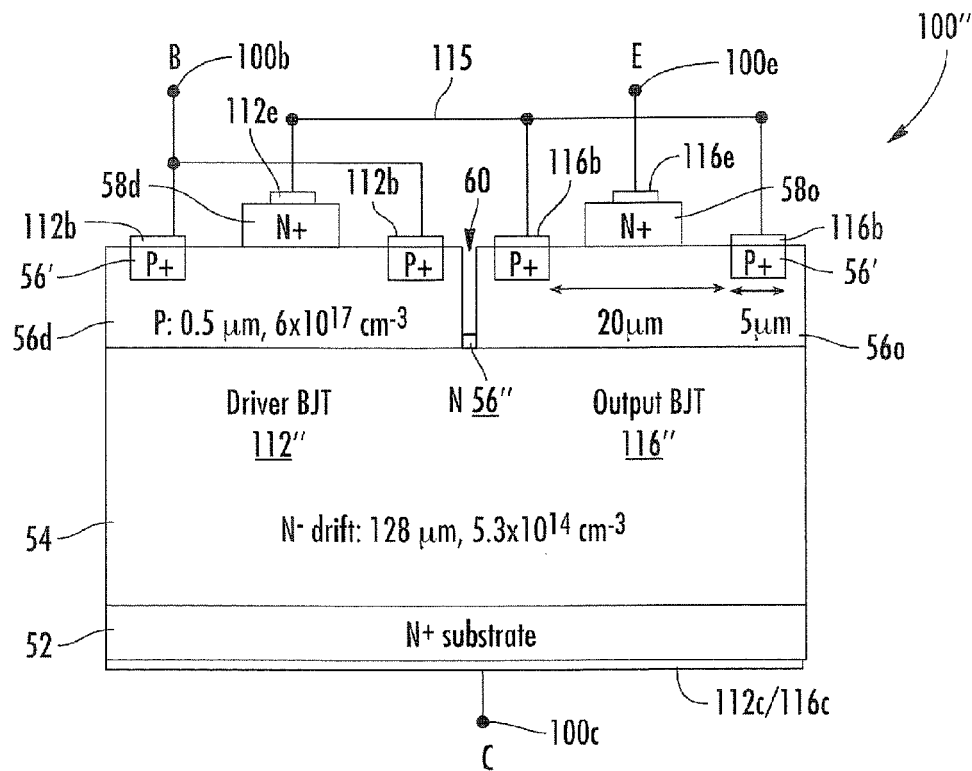
FIG. 6 is a cross-sectional view illustrating a two-stage Darlington transistor unit cell according to still further embodiments of the present invention.

Still referring to FIG. 1B, the n⁺ emitter layer 58 may be patterned, for example, using reactive ion etching (RIE), to form the emitter "fingers" 58*d* and 58*o* of the driver BJT 112 and the output BJT 116, respectively. The widths of the emitter fingers 58*d*/58*o* and the p⁺ regions 56' may be about 10 micrometers (μm) and about 5 μm, respectively. The base layer 56 may also be patterned to provide a trench 60 that electrically isolates the driver BJT 112 and the output BJT 116. In particular, the base layer 56 may be etched to form electrically isolated mesas 56*d* and 56*o* with a spacing or gap 60 of about 4 μm or less, such that both BJTs 112 and 116 are shielded from each other in the OFF state. In some embodiments, additional p⁺ regions 54' may be implanted or otherwise provided in the n-type drift layer 54 at a base or bottom of the trench 60 adjacent each of the mesas 56*d* and 56*o*, as shown in FIG. 5, to provide improved isolation between the driver BJT 112' and the output BJT 116', thereby increasing the blocking voltage of the Darlington transistor 100'. The p⁺ regions 54' may be spaced apart by a distance of about 2-3 μm or less. In other embodiments, as shown in FIG. 6, the base layer 56 may not be completely etched-through to define the trench 60 therein, and a lightly doped n-type region 56" may be implanted or otherwise provided in the base layer 56 at a bottom of the trench 60 between the mesas 56*d* and 56*o* to provide isolation between the driver BJT 112" and the output BJT 116" of the Darlington transistor 100".

As shown in FIG. 1C, a 900 μm wide p-type junction termination extension (JTE) 190 is implemented around the periphery of the active area of the output BJT 116 to reduce the electric field crowding under reverse bias. Surface passivation may be performed by a wet thermal oxidation for about 2 hours at greater than about 1000° C., followed by a one hour argon (Ar) annealing, and then nitrogen oxygen (NO) re-annealing at about 1175° C. for about three hours. After thermal oxidation, 1 μm silicon dioxide and 500 nm silicon nitride may be deposited by plasma enhanced chemical vapor deposition (PECVD) to protect the thermal passivation layer.

Referring again to FIG. 1B, ohmic contacts are formed on the n⁺ silicon carbide emitter fingers 58*d* and 58*o* to define the emitter terminals 112*e* and 116*e* for the driver and output BJTs 112 and 116, respectively. Ohmic contacts are also formed on the p⁺ regions 56' of the base layer 56 to define the base terminals 112*b* and 116*b* for the driver and output BJTs 112 and 116, respectively. For example, after patterning the field oxide layer provided by the PECVD process, the ohmic contacts may be formed on the emitter layer 58 and the base layer 56 by sintering nickel (Ni) and aluminum/titanium (Al/Ti) films, respectively. Two metal systems with relatively thick titanium/gold layers may be used. For example, the first metallization may connect the base regions 56' through a bus, while the second metallization may connect the interdigitized emitter fingers 58*d*/58*o*. An ohmic contact is further formed on the lower surface of the substrate 52 to provide a collector terminal 112*c*/116*c* for both the driver BJT 112 and the output BJT 116.

Accordingly, as shown on the left-hand side of FIG. 1B, the n-type substrate 52, the n-type drift layer 54, the p-type mesa 56*d*, and the n-type emitter finger 58*d* define the driver BJT 112. Likewise, as shown on the right-hand side of FIG. 1B, the n-type substrate 52, the n-type drift layer 54, the p-type mesa 56*o*, and the n-type emitter finger 58*o* define the output BJT 116. The ohmic contact 112*c*/116*c* on n⁺ substrate 52 opposite the drift layer 54 provides the collector terminals for both the driver BIT 112 and the output BJT 116, as well as the collector terminal 100*c* of the 10 kV SiC Darlington transistor 100. A conductive line 115 electrically connects the base terminals 116*b* of the output BJT 116 to the emitter terminal 112*e* of the driver BJT 112. The contact 112*b* on the p⁺ region 56' of the base layer 56 provides the base terminal 100*b* of the 10 kV SiC Darlington transistor 100, and the contact 116*e* on the emitter finger 58*o* provides the emitter terminal 100*e* of the 10 kV SiC Darlington transistor 100.

The area ratio of the output BJT 116 as compared to the driver BJT 112 may affect the current gain of Darlington transistors according to some embodiments of the present invention. As used herein, the term "area ratio" refers to the relative footprint of the output transistor on a wafer or substrate as compared to that of the driver transistor in plan view. For example, a comparatively large driver BJT may provide a higher current gain at lower current densities, but the gain may be sharply reduced at higher current densities. Some embodiments of the present invention provide a SiC Darlington transistor where the area or footprint of the output BIT 116 is many times greater than that of the driver BJT 112. For example, in some embodiments, the area ratio of the output BJT 116 to the driver BJT 112 may be approximately 5:1; in other embodiments, the area ratio of the output BJT 116 to the driver BJT 112 may be approximately 4:1; and in still other embodiments, the area ratio of the output BJT 116 to the driver BJT 112 may be approximately 3:1. However, embodiments of the present invention may include output-to-driver transistor area ratios within a range of about 3:1 to about 5:1, which may be critical to providing the higher current gains described herein. In particular, the current gain of a Darlington transistor whose constituent output and driver transistors have an output-to-driver transistor area ratio of between about 3:1 to about 5:1 may provide a greater current gain than a Darlington pair with an output-to-driver transistor area ratio of greater than about 5:1, as well as a greater current gain than a Darlington pair with an output-to-driver transistor area ratio of less than about 3:1. Thus, in order to provide higher current gain and reduce the required base current according to some embodiments of the present invention, the output-to-driver transistor area ratio should be within the critical ranges described herein.

Referring again to FIG. 1C, the Darlington die 195 may have a chip size of about 4.2 mm by about 4.2 mm, with an active area of about 3.7 mm² (including the area occupied by both the output BJTs 116 on the die 195 and the driver BJTs 112 on the die 195). SiC BJTs with a similar chip size were also fabricated in conjunction with the SiC Darlington transistor 100 on the same wafer for purposes of comparison, as described below with reference to the experimental results illustrated in the graphs of FIGS. 2 and 3.

FIG. 2 is a graph illustrating the forward current density (J)-voltage (V) characteristics of a 4H—SiC monolithic Darlington transistor (such as the Darlington transistor 100 of FIGS. 1A-1C) according to some embodiments of the present invention at room temperature (e.g., about 25° C.) as compared to the J-V curves of a SiC BJT of similar area. In FIG. 2, the SiC BJT has a maximum base current $I_{B, BJT}$ of about 60 mA with 10 mA intervals between illustrated values of $I_{B, BJT}$, while the SiC Darlington transistor has a maximum base current $I_{B, Darlington}$ of about 5 mA with 1 mA intervals between the illustrated values of $I_{B, Darlington}$. A low differential on-resistance of 40 mΩ·cm² at about 3.5 V indicates that both driver and output BJTs of the SiC Darlington pair are operating in the voltage saturation region when the collector-emitter voltage $V_{CE}$ exceeds about 2.7 V. At collector current densities of greater than about 30 A/cm², the SiC Darlington transistor exhibits a similar forward voltage drop (i.e., $V_{CE}$), as the SiC BJT, because, for such high voltage devices, the drift layer resistance may dominate the total on-resistance. FIG. 2 also includes lines labeled "200 W/cm²" and "300 W/cm²", which show the power dissipated per square centimeter as a function of the collector current density and the forward voltage drop. At a package power dissipation limit of about 200 W/cm², the SiC Darlington transistor has a forward voltage of about 5.2 V at a current density of about 37 A/cm², which provides a specific on-resistance of about 140 mΩ·cm². The operating current density increases to about 50 A/cm² at a package power dissipation limit of about 300 W/cm².

Still referring to FIG. 2, SiC Darlington transistors according to some embodiments of the present invention provide a higher current gain than a single SiC BJT. In particular, power SiC Darlington transistors according to some embodiments of the present invention may be operated in the saturation or the quasi-saturation region, where the forward drop and, hence, the conduction losses may be lower. The current gain under these operation conditions is typically referred to as the forced current gain ($\beta_{forced}$). The forced current gain $\beta_{forced}$ may be approximately equal to the product of the driver transistor current gain $\beta_{driver}$ and the output transistor current gain $\beta_{output}$ (e.g., $\beta_{forced} \approx \beta_{driver} \times \beta_{output}$), where the driver transistor operates in its active region, and where the output transistor operates in its saturation or quasi-saturation region. As used herein, the "current gain" of the driver and output transistors refers to the ratio of their respective collector currents ($I_C$) to their respective base currents ($I_B$). In other words, $\beta_{driver} = I_{Cdriver}/I_{Bdriver}$, and $\beta_{output} = I_{Coutput}/I_{Boutput}$. The forced current gain of a Darlington transistor according to some embodiments of the present invention $\beta_{forced, Darlington}$ may be approximately equal to $I_{Coutput}/I_{Bdriver}$.

As shown in FIG. 2, Darlington transistors according to some embodiments of the present invention may have a forced current gain $\beta_{forced, Darlington}$ of about 336 and a base current $I_{Bdriver}$ of about 4 mA at power dissipation density of about 200 W/cm², as compared to a forced current gain $\beta_{forced, BJT}$ of about 30 for a SiC BJT under similar conditions. The gain could be even higher and higher collector current levels when both driver and output BJTs of the Darlington transistor according to some embodiments of the present invention operate in the active region. For example, a forced current gain of about 1100 was measured on Darlington transistor according to some embodiments of the present invention at a collector current density of about 120 A/cm², as compared to a forced current gain of about 43 for a SiC BJT under similar conditions. Accordingly, Darlington transistors according to some embodiments of the present invention provide a forced current gain many times that of a conventional SiC BJT. As such, Darlington transistors according to some embodiments of the present invention may be operated with a reduced base current as compared to a single BJT in high voltage applications, which may reduce power consumption of the driver circuit.

The blocking characteristics of SiC Darlington transistors according to some embodiments of the present invention are also shown in FIG. 2. As used herein, a "blocking voltage" refers to the voltage that may be applied across the collector and the emitter of a transistor when the transistor is in its "off" state without significant leakage current flowing through collector and the emitter. The "breakdown voltage" of a transistor refers to the voltage applied across collector and the emitter of the transistor in its "off" state at which significant leakage current starts to flow. In particular, the open-emitter blocking voltage ($BV_{CBO}$) for a Darlington transistor according to some embodiments of the present invention was measured to be about 10 kV at a leakage current of less than about 1 mA/cm². The open-base blocking voltage ($BV_{CEO}$) for a Darlington transistor according to some embodiments of the present invention was less than about 9.5 kV at the same leakage current. It is noted that Darlington transistors according to some embodiments of the present invention may have a reverse blocking voltage that is about 2 kV lower than a comparable BJT fabricated on the same or similar wafer with a similar die size. However, the structures of FIGS. 5 and 6 may provide improved isolation between the driver BJT and the output BJT due to the implanted p-type regions 54' and n-type regions 56" therein, respectively, which may increase the blocking voltage in some embodiments.

Figure 3:
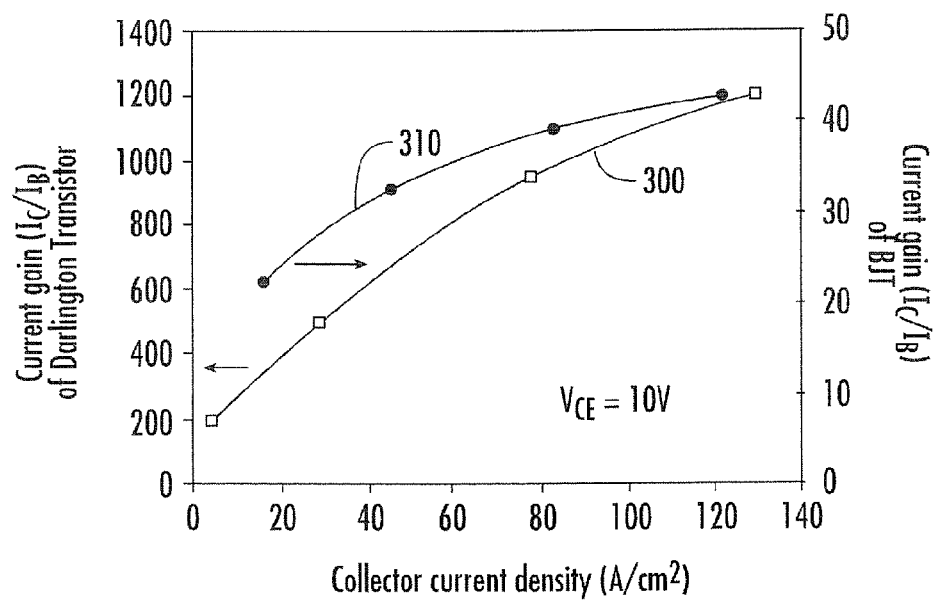
FIG. 3 is a graph illustrating the current gain vs. collector current density of a two-stage Darlington transistor according to some embodiments of the present invention as compared to a single BJT.

FIG. 3 is a graph illustrating the dependence of the current gain in the active region on the collector current density for SiC Darlington transistors according to some embodiments of the present invention as compared to SiC BJTs at room temperature (e.g., about 25° C.). As shown in FIG. 3, the current gain of a SiC Darlington transistor according to some embodiments of the present invention (illustrated by line 300, with legend on left-hand side of FIG. 3), as well as the current gain of a single SiC BJT (illustrated by line 310, with legend on right-hand side of FIG. 3) continues to increase with the collector current density over the measured current density range, indicating that the space charge recombination is dominant for such high voltage devices. However, FIG. 3 illustrates that the current gain of the SiC Darlington transistor according to some embodiments of the present invention is more than 10 times greater than that of the single SiC BJT. Accordingly, SiC Darlington transistors according to some embodiments of the present invention may be operated with a reduced base current as compared to a single SiC BJT to provide the same or similar collector current, which may significantly reduce the power consumption of a driver circuit. This may make SiC Darlington transistors according to some embodiments of the present invention more attractive for high power, high temperature applications.

Figure 4:
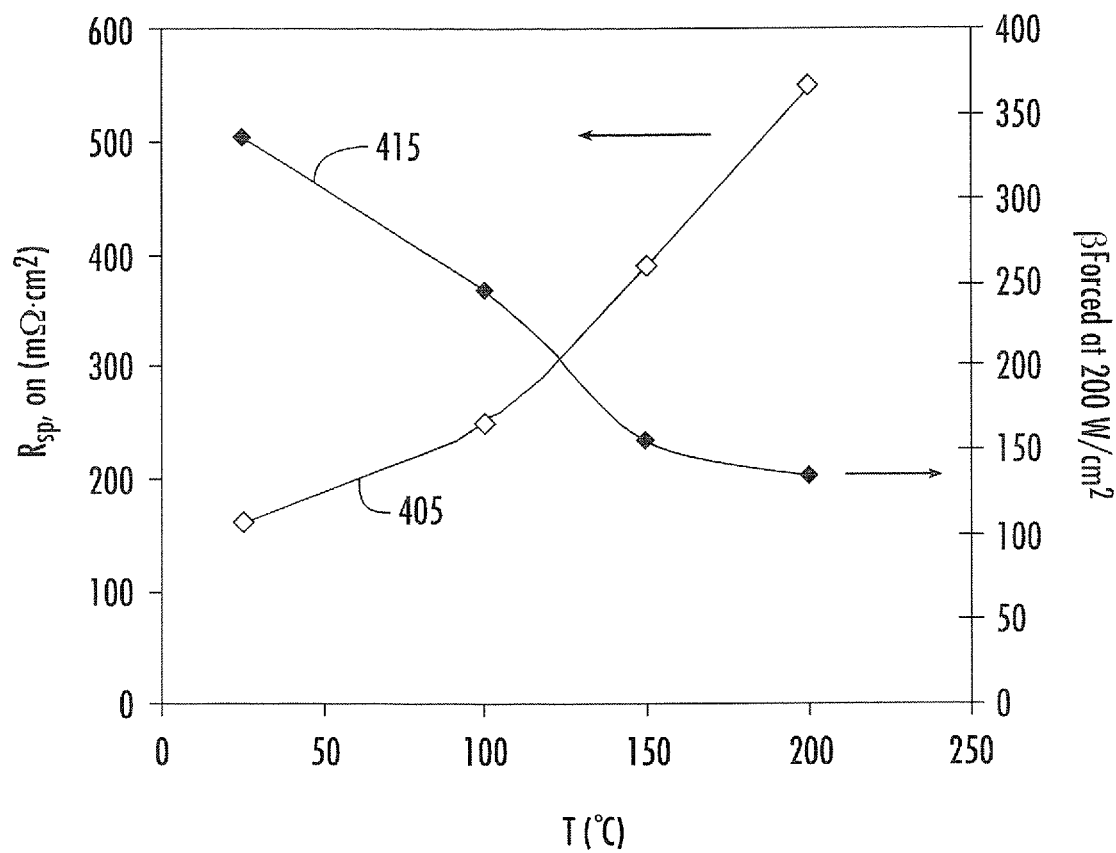
FIG. 4 is a graph illustrating the temperature dependence of current gain and on-resistance for two-stage Darlington transistors according to some embodiments of the present invention.

FIG. 4 is a graph illustrating the temperature dependence of forced current gain $\beta_{forced}$ and specific on-resistance $R_{sp,\,on}$ for a 10 kV SiC Darlington transistor according to some embodiments of the present invention. As shown in FIG. 4, the Darlington transistor has a positive temperature coefficient for the on-resistance $R_{sp,\,on}$ and a negative temperature coefficient for the current gain $\beta_{forced}$. In other words, the on-resistance $R_{sp,\,on}$ of the Darlington transistor increases as the Darlington transistor operating temperature increases (as illustrated by line 405, with legend on left-hand side of FIG. 4), while the current gain $\beta_{forced}$ decreases as the Darlington transistor operating temperature increases (as illustrated by line 415, with legend on right-hand side of FIG. 4). For example, at about 200° C., the specific on-resistance $R_{sp,\,on}$ of a Darlington transistor according to some embodiments of the present invention increases to about 550 mΩ·cm², and the forced current gain $\beta_{forced}$ decreases to about 135. The increase in the on-resistance $R_{sp,\,on}$ may be attributed to the reduction of the mobility in the drift layer at higher temperatures. The reduction in the current gain $\beta_{forced}$ may be associated with the increased ionization of deep level acceptors at elevated temperatures in the base, which in turn, may reduce the emitter injection efficiency.

FIGS. 5 and 6 illustrate configurations of SiC Darlington transistors according to some embodiments of the present invention that may provide similar current gains as described above along with improved device isolation, and thus, increased blocking voltages. The layers 52, 54, 56, and 58 and/or fabrication of the SiC Darlington transistor 100' of FIG. 5 and the SiC Darlington transistor 100" of FIG. 6 may be similar to those described above with reference to FIG. 1B. As noted above, the SiC Darlington transistor 100' of FIG. 5 further includes p⁺ regions 54' in the n-type drift layer 54 at a base of the trench 60 adjacent each of the mesas 56d and 56o to provide improved isolation between the driver BJT 112' and the output BJT 116' of the SiC Darlington transistor 100'. Also, the SiC Darlington transistor 100" of FIG. 6 further includes the trench 60 in the base layer 56, and a lightly doped n-type region 56" in the base layer 56 at a bottom of the trench 60 between the mesas 56d and 56o and extending through the remainder of the base layer 56 to provide improved isolation between the driver BJT 112" and the output BJT 116" of the Darlington transistor 100".

Figure 7A:
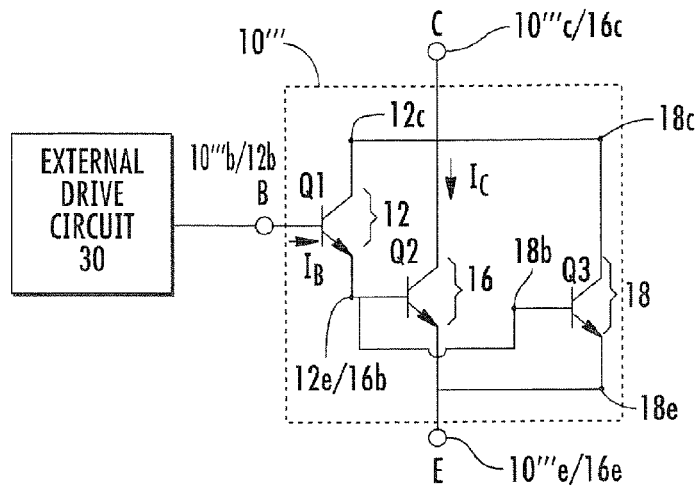
FIG. 7A is a schematic circuit diagram illustrating a two-stage Darlington transistor according to yet further embodiments of the present invention.

FIG. 7A is a circuit diagram of a 10 kV a wide bandgap two-stage Darlington transistor 10''' according to further embodiments of the present invention that includes an avalanche current path in the active region of the device. As known to those of skill in the out, "avalanche breakdown" (which is sometimes simply referred to as "avalanche") in a BJT refers to a rapid current multiplication that can occur when a strong electric field is applied to the device. In power SiC BJTs, much of this avalanche current will typically flow through the junction termination region of the device that surrounds the active area of the device. Unfortunately, when this occurs, the avalanche current may permanently destroy the device. As will be discussed below, the high power Darlington transistors according to embodiments of the present invention may include leakage current paths within the active area of the device that carry the avalanche current when the device breaks down. When the avalanche current is carried through these leakage current paths it will not destroy the device, and hence the Darlington transistors according to certain embodiments of the present invention may survive avalanche events.

As shown in FIG. 7A, the SiC Darlington transistor 10''' includes a SiC NPN driver BJT Q1 12 connected to a SiC NPN output BJT Q2 16 in a manner similar to that described above with reference to FIG. 1A. A third "avalanche" SiC BJT Q3 18 having a base 18b, an emitter 18e and a collector 18c is electrically connected in parallel to the output SiC BJT Q2 16. This avalanche BJT Q3 18 provides a current path for avalanche currents in the event of device breakdown.

Figure 7B:
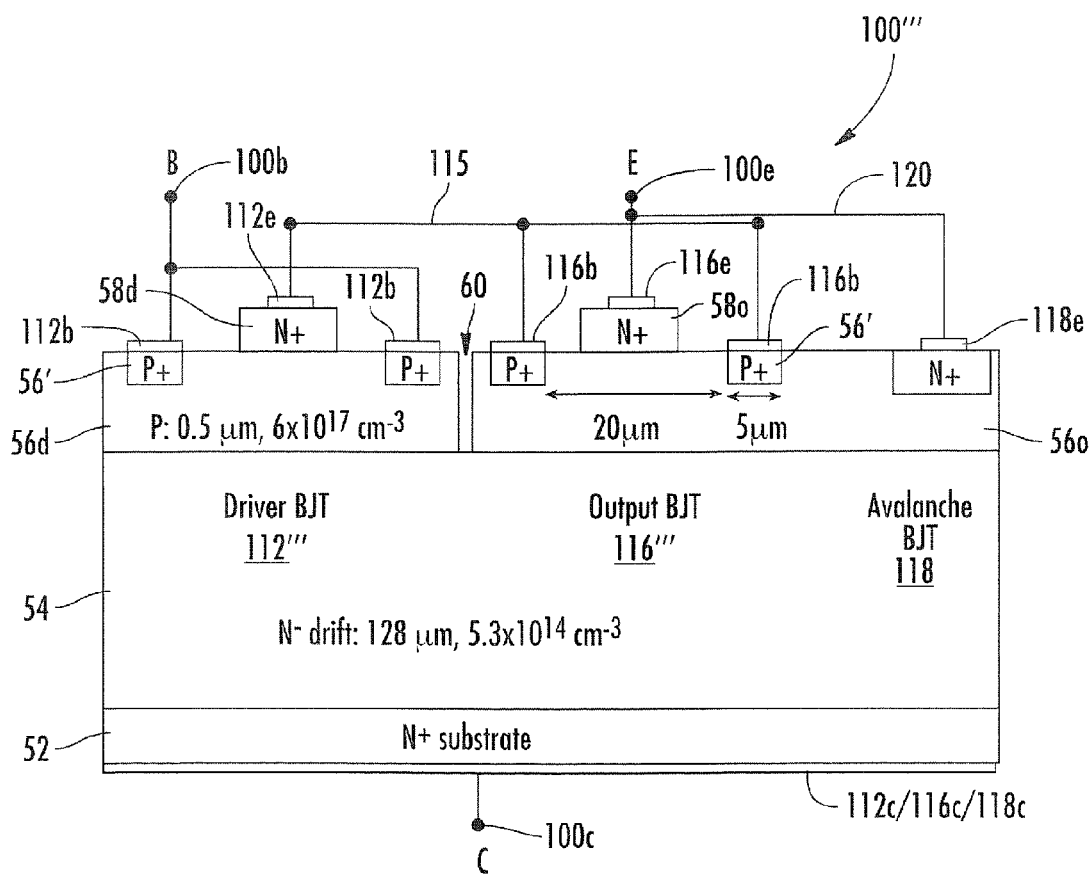
FIG. 7B is a cross-sectional view illustrating a two-stage Darlington transistor unit cell according to yet further embodiments of the present invention.

FIG. 7B illustrates a cross-sectional view of a Darlington transistor 100''' including an avalanche BJT Q3 118 (shown at the right-hand side of FIG. 7B) in parallel with the output BJT Q2 116'''. The layers 52, 54, 56, and 58 and/or fabrication of the SiC Darlington transistor 100''' of FIG. 7B may be similar to those described above with reference to FIG. 1B. As shown in FIG. 7B, an n+ emitter region 58a is provided in the p-type base layer 56 and is electrically connected to the emitter terminal 116e of the output BJT Q2 116''' by a conductive line 120. The emitter region 58a of the avalanche BJT Q3 118 is thereby formed deeper into the device than the emitter finger 58o of the output BIT Q2 116'''. As a result, the portion of the base layer 56o of the avalanche BJT Q3 118 between the emitter region 58a and the drift layer 54 is thinner than the portion of the base layer 56o of the output BJT Q2 116''' between the emitter finger 58o and the drift layer 54. Thus, in the avalanche BJT Q3 118, the emitter-base p-n junction is closer to the collector-base p-n junction than are the corresponding p-n junctions in the output BJT Q2 116'''. Accordingly, when an avalanche condition occurs, a leakage current path is provided through the avalanche BJT Q3 118. This is a non-destructive leakage current path, allowing the Darlington transistor 100''' to handle an avalanche event without being destroyed.

As described in detail above, some embodiments of the present invention may provide a 10 kV 4H—SiC two-stage Darlington transistor with a forced current gain of about 336 at room temperature (i.e., about 25° C.), which may be reduced to a current gain of about 135 at a temperature of about 200° C. By way of comparison, a single SiC BJT may provide a forced current gain of about 30 at room temperature, with a similar forward voltage drop. Thus, two-stage SiC Darlington transistors according to some embodiments of the present invention may have a significantly higher current gain as compared to a single SiC BJT (336 vs. 30) with no penalty in the forward voltage drop, which may reduce power consumption under similar conditions. The specific on-resistance of two-stage SiC Darlington transistors according to some embodiments of the present invention may be about 140 mΩ·cm² at room temperature, and may increase at elevated temperatures. Two-stage SiC Darlington transistors according to some embodiments of the present invention may also exhibit an open emitter blocking voltage ($BV_{CBO}$) of about 9.5 kV, and an open-base blocking voltage ($BV_{CEO}$) of about 10 kV at a leakage current density of less than about 1 mA/cm².

Figure 8A:
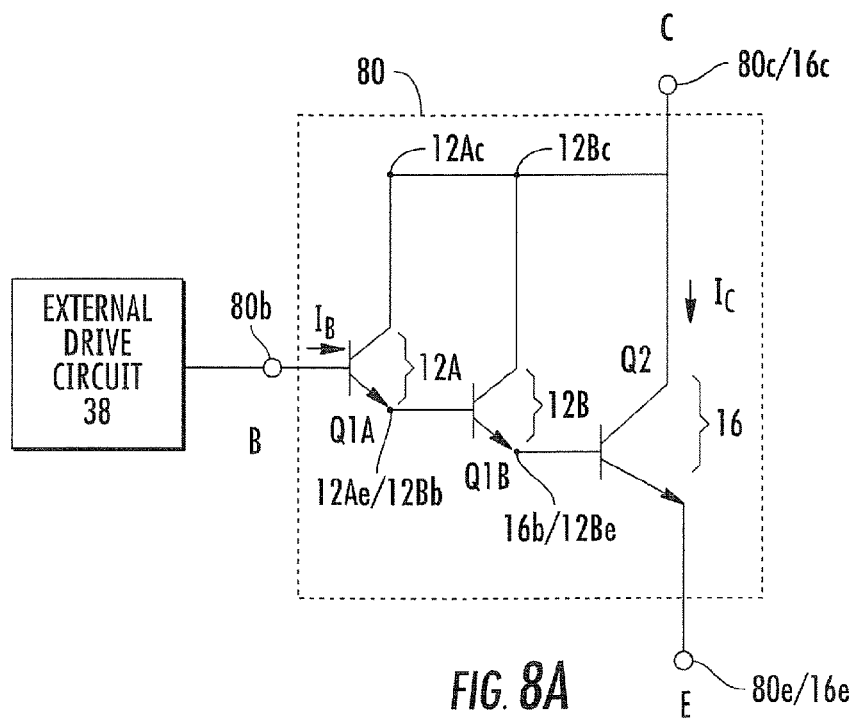
FIG. 8A is a schematic circuit diagram illustrating a three-stage Darlington transistor according to further embodiments of the present invention.

FIG. 8A is a circuit diagram illustrating a wide bandgap three-stage Darlington transistor 80 according to some embodiments of the present invention. Such wide bandgap devices include an active semiconductor layer of a wide bandgap material, such as silicon carbide (SiC), gallium nitride (GaN), and/or other Group-III nitride material. As shown in FIG. 8A, a wide bandgap bipolar NPN transistor Q1A 12A functions as a first driver transistor, a wide bandgap bipolar NPN transistor Q1B 12B functions as a second driver transistor, and a wide bandgap bipolar NPN output transistor Q2 16 is coupled to the driver transistor Q1B 12B to form a Darlington transistor 80 having a base terminal 80b, a collector terminal 80c, and an emitter terminal 80e. In particular, a collector terminal 16c of the output transistor Q2 16 is coupled to the collector terminal 12Bc of the driver transistor Q1B 12B, and the base terminal 16b of the output transistor Q2 16 is coupled to the emitter terminal 12Be of the driver transistor Q1B 12B. Also, the collector terminal 12Bc of the driver transistor Q1B 12B is coupled to the collector terminal 12Ac of the driver transistor Q1A 12A, and the base terminal 12Bb of the driver transistor Q1B 12B is coupled to the emitter terminal 12Ae of the driver transistor Q1A 12A. The wide bandgap Darlington transistor 80 employs a cascade configuration where the driver transistors Q1A 12A and Q1B 12B have a relatively small footprint, and the output transistor Q2 16 has a relatively large footprint. Such a configuration can be achieved by monolithic integration or hybrid combination of the transistors 12A, 12B, and 16. The wide bandgap three-stage Darlington transistor 80 can be turned on with a reduced base current $I_B$ as compared to a two-stage wide bandgap Darlington, which may further reduce power consumption of the external drive circuit 38. Also, although not shown, the wide bandgap three-stage Darlington transistor 80 may further include an avalanche BJT coupled in parallel with the output BJT 16, in a manner similar to that illustrated in FIG. 7A.

Figure 8B:
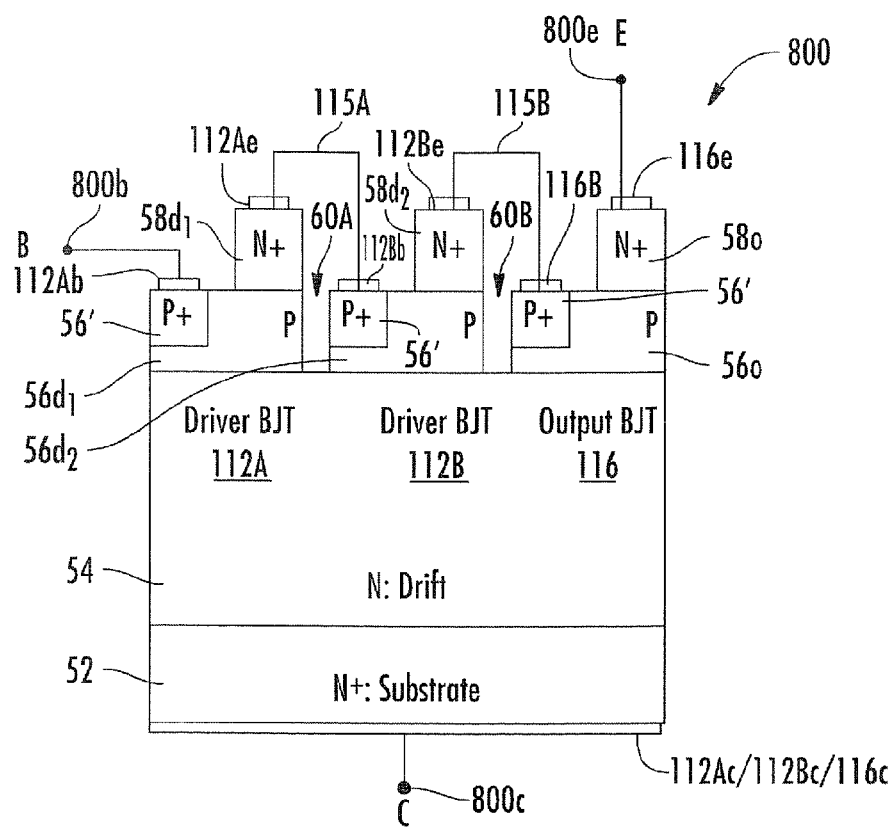
FIG. 8B is a cross-sectional view illustrating a three-stage Darlington transistor unit cell according to further embodiments of the present invention.

FIG. 8B illustrates a cross-sectional view of a 10 kV three-stage SiC Darlington transistor unit cell 800 according to some embodiments of the present invention. The SiC Darlington transistor unit cell 800 includes a relatively large SiC output BJT 116 that is driven by relatively small first and second SiC driver BJTs 112A and 112B. The output BJT 116 takes up the vast majority of the area of the device. The footprint of the output BJT 116 may be approximately 3 to 5 times greater than that of the driver BJTs 112A and/or 112B. As shown in FIG. 1B, according to some embodiments of the present invention, the 10 kV SiC Darlington transistor 800 may be implemented as a monolithic structure that is formed on a bulk single crystal n-type 4H SiC substrate 52. The right-hand side of FIG. 8B illustrates a cross-sectional view of the output BJT 116, the left-hand side of FIG. 8B illustrates a cross-sectional view of the first driver BJT 112A, and the middle portion of FIG. 8B illustrates a cross-sectional view of the second driver BJT 112B. All three BJTs 112A, 112B, and 116 may have a cell pitch of 25 μm.

The layers 52, 54, 56, and 58 and/or fabrication of the three-stage SiC Darlington transistor 800 may be similar to those described above with reference to FIG. 1B. As such, the $n^+$ emitter layer 58 may be patterned, for example, using reactive ion etching (RIE), to form the emitter fingers $58d_1$, $58d_2$, and $58o$ of the BJTs 112A, 112B, and 116, respectively. The widths of the emitter fingers and the $p^+$ regions 56' may be about 10 micrometers (μm) and about 5 μm, respectively. The base layer 56 may also be patterned to provide a trenches 60A and 60B. The trench 60A electrically isolates the first driver BJT 112A from the second driver BJT 112B, while the trench 60B electrically isolates the second driver BJT 112B from the output BJT 116. In particular, the base layer 56 may be etched to form electrically isolated mesas $56d_1$, $56d_2$, and $56o$ with a spacing or gap of about 4 μm or less, such that all three BJTs 112A, 112B, and 116 are shielded from one another in the OFF state. Although not shown, in some embodiments, additional $p^+$ regions may be implanted or otherwise provided in the n-type drift layer 54 at a base or bottom of the trenches 60A and 60B, to provide improved device isolation as similarly shown in FIG. 5. In other embodiments, as similarly shown in FIG. 6, the base layer 56 may not be completely etched-through to define the trenches 60A and 60B therein, and a lightly doped n-type region may be provided in the base layer 56 at a bottom of the trenches 60A and 60B between the mesas $56d_1$, $56d_2$, and $56o$ to provide improved device isolation.

Ohmic contracts may also be formed on the emitter fingers $58d_1$, $58d_2$, and $58o$ to define the emitter terminals 112Ae, 112Be, and 116e for the devices, as well as on the $p^+$ regions 56' of the base layer 56 to define the base terminals 112Ab, 112Bb, and 116b for the devices. An ohmic contact is further formed on the lower surface of the substrate 52 to provide a collector terminal 112Ac/112Bc/116c for all three BJTs 112A, 112B, and 116, as well as the collector terminal 100c of the 10 kV SiC Darlington transistor 100. A first conductive line 115A electrically connects the emitter terminal 112Ae to the base terminal 112Bb of the second driver transistor 112B, and a second conductive line 115B electrically connects the emitter terminal 112Be of the second driver transistor 112B to the base terminal 116b of the output BJT 116. The contact 112Ab on the $p^+$ region 56' of the base layer 56 provides the base terminal 800b of the 10 kV SiC Darlington transistor 100, and the contact 116e on the emitter finger 58o provides the emitter terminal 800e of the 10 kV SiC Darlington transistor 800.

Figure 9:
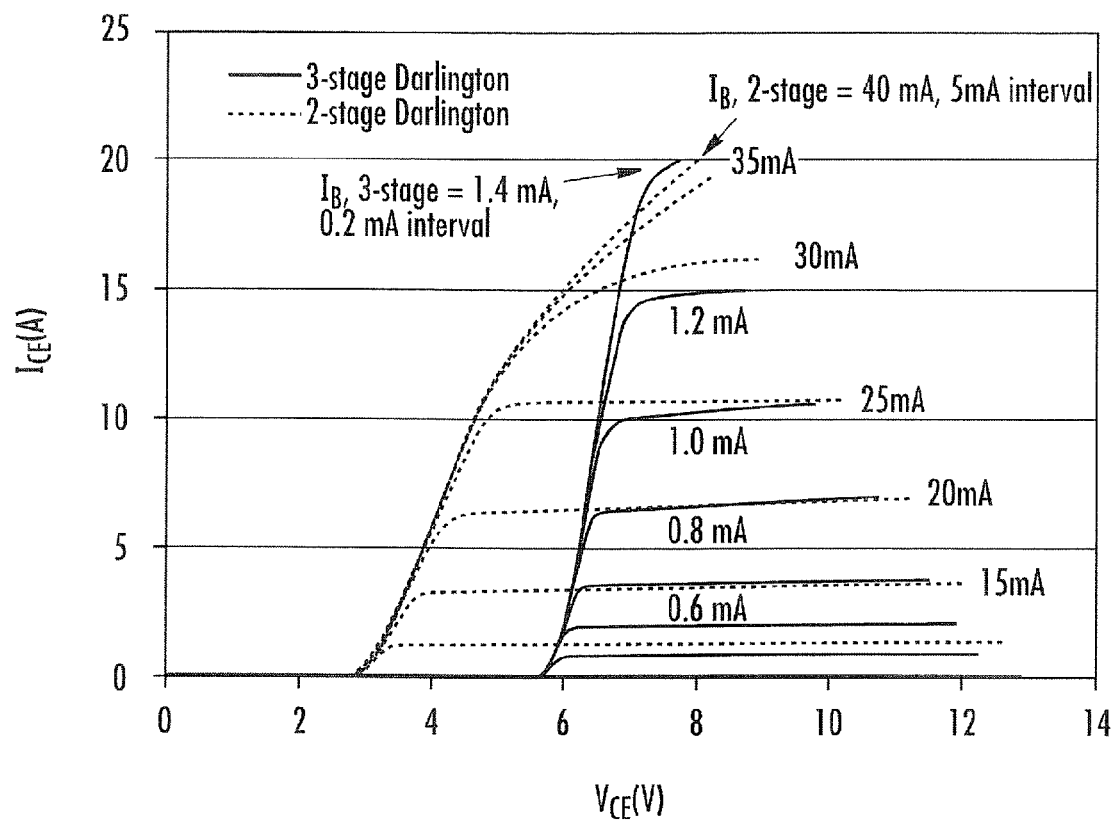
FIG. 9 is a graph illustrating output characteristics of a three-stage Darlington transistor according to further embodiments of the present invention as compared to a two-stage Darlington transistor according to some embodiments of the present invention.

FIG. 9 is a graph of experimental results illustrating the collector current (I)-voltage (V) characteristics of a three-stage SiC Darlington transistor (such as the Darlington transistors of FIGS. 8A-8B) as compared to that of a two-stage SiC Darlington transistor (such as the Darlington transistors of FIGS. 1A-1C) according to some embodiments of the present invention at room temperature (e.g., about 25° C.). The data shown in FIG. 9 was measured on relatively large area devices, which may have active areas about 10 times larger than the devices described herein; as such, while current values illustrated in FIG. 9 may be about 10 times larger than the current values provided by two- and three-stage SiC Darlington transistors according to some embodiments of the present invention, the data may accurately represent the current gains of devices according to some embodiments of the present invention. In particular, as shown in FIG. 9, the two-stage SiC Darlington transistor has a maximum base current $I_{B, 2\text{-}stage}$ of about 40 mA with 5 mA intervals between illustrated values of $I_{B, 3\text{-}stage}$, while the three-stage SiC Darlington transistor has a maximum base current $I_{B, 3\text{-}stage}$ of about 1.4 mA with 0.2 mA intervals between the illustrated values of $I_{B, 3\text{-}stage}$. The current gain of a three-stage SiC Darlington transistor according to some embodiments of the present invention may be approximately equal to the product of the first driver transistor current gain $\beta_{driver1}$, the second driver transistor current gain $\beta_{driver2}$, and the output transistor current gain $\beta_{output}$ (e.g., $\beta_{3\text{-}stage} \approx \beta_{driver1} \times \beta_{driver2} \times \beta_{output}$), and may be approximated as $I_{Coutput}/I_{Bdriver1}$. As the base current values $I_{B, 3\text{-}stage}$ are relatively low, three-stage SiC Darlington transistors according to some embodiments of the present invention provide an even higher current gain than the two-stage SiC Darlington transistors described herein. In particular, three-stage SiC Darlington transistors according to some embodiments of the present invention may provide a current gain of about 10,000 or more. Accordingly, three-stage SiC Darlington transistors according to some embodiments of the present invention provide a forced current gain many times that of a two-stage SiC Darlington transistor, and thus, may be operated with even further reduced base currents.

Accordingly, relatively high voltage (for example, greater than about 10 kV) SiC Darlington transistors according to some embodiments of the present invention may provide a forward voltage drop similar to that of SiC BJTs, but may exhibit a much higher current gain than SiC BJTs, allowing for a reduced base current, which may reduce the power consumption of the driver circuit. Thus, Darlington transistors according to some embodiments of the present invention may be attractive for high power, high temperature applications, such as power switching devices and/or sensors.

Embodiments of the present invention as described above with reference to FIGS. 1-9 can be achieved by monolithic integration or a hybrid combination of the wide bandgap bipolar transistors that provide the Darlington pairs described herein. As used herein, a "hybrid" device may refer to a combination of two discrete bipolar transistors, for example, in a cascade configuration. A "monolithic" device may refer to a device where both the bipolar transistors are fabricated in the same semiconductor chip and/or substrate. A packaged power device according to some embodiments of the present invention may include both monolithic and hybrid combinations of the bipolar transistors described herein.

While the above embodiments are described with reference to particular figures, it is to be understood that some embodiments of the present invention may include additional and/or intervening layers, structures, or elements, and/or particular layers, structures, or elements may be deleted. More generally, the foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A packaged power electronic device, comprising:
   a bipolar driver transistor comprising a wide bandgap semiconductor material and having a driver base terminal, a driver collector terminal, and a driver emitter terminal; and
   a bipolar output transistor comprising a wide bandgap semiconductor material and having an output base terminal, an output collector terminal, and an output emitter terminal, wherein the output collector terminal is coupled to the driver collector terminal, and wherein the output base terminal is coupled to the driver emitter terminal to provide a Darlington pair,
   wherein a blocking voltage of the packaged power electronic device is greater than about 5 kilovolts (kV).

2. The device of claim 1, wherein an area ratio of the area of the output transistor to the area of the driver transistor is between about 3:1 to about 5:1.

3. The device of claim 1, wherein an area ratio of the area of the output transistor to the area of the driver transistor is about 5:1.

4. The device of claim 1, further comprising:
   a bipolar avalanche transistor comprising a wide bandgap semiconductor material and having a base terminal coupled to the output base terminal, a collector terminal coupled to the output collector terminal, and an emitter terminal coupled to the output emitter terminal.

5. The device of claim 1, further comprising:
   a substrate of a first conductivity type, wherein the substrate includes a common collector terminal thereon that provides the driver and output collector terminals;
   a drift layer of the first conductivity type on the substrate opposite the common collector terminal, the drift layer having a lower carrier concentration than that of the substrate;
   a base layer of a second conductivity type opposite the first conductivity type on the drift layer opposite the substrate, the base layer comprising a trench therein that defines first and second electrically isolated mesas, the first mesa including the driver base terminal thereon, and the second mesa including the output base terminal thereon; and
   an emitter layer of the first conductivity type on the base layer opposite the drift layer, the emitter layer comprising first and second electrically isolated portions, the first portion including the driver emitter terminal thereon, and the second portion including the output emitter terminal thereon.

6. The device of claim 5, wherein the trench surrounds a periphery of the first mesa and separates the first and second mesas of the base layer by a distance of about 4 µm or less to electrically isolate the driver transistor and the output transistor at voltages of about 10 kV or less.

7. The device of claim 5, wherein the drift layer comprises:
   a first region of the second conductivity type in the drift layer at a bottom of the trench adjacent the first mesa of the base layer; and
   a second region of the second conductivity type in the drift layer at the bottom of the trench adjacent the second mesa of the base layer.

8. The device of claim 5, wherein the trench does not extend completely through the base layer, and further comprising:
   a region of the first conductivity type in the base layer at a bottom of the trench between the first and second mesas, the region comprising a dopant concentration that is sufficient to electrically isolate the driver transistor and the output transistor from one another.

9. The device of claim 5, further comprising:
   a region of the first conductivity type in the second mesa of the base layer adjacent to the base terminal of the output transistor, the region of the first conductivity type being electrically connected to the output emitter terminal on the second portion of the emitter layer,
   wherein a portion of the base layer between the region of the first conductivity type therein and the drift layer is thinner than a portion of the base layer between the second portion of the emitter layer and the drift layer to provide a non-destructive avalanche current path within an active area of the device.

10. The device of claim 5, wherein the driver and output transistors comprise silicon carbide (SiC) bipolar junction transistors, and wherein the device has a current gain of greater than about 300 at room temperature.

11. The device of claim 9, wherein the current gain of the device increases as collector current density of the output transistor increases, and wherein the current gain of the device decreases as operating temperature of the device increases.

12. The device of claim 1, wherein the driver transistor comprises a second driver transistor, and further comprising:
a first driver transistor having a first driver base terminal, a first driver collector terminal, and a first driver emitter terminal,
wherein the first driver emitter terminal is coupled to the second driver base terminal, and wherein the first driver collector terminal is coupled to the second driver collector terminal and the output collector terminal.

13. The device of claim 12, wherein the first driver transistor, the second driver transistor, and the output transistor comprise silicon carbide (SiC) bipolar junction transistors, and wherein the device has a current gain of greater than about 10,000.

14. The device of claim 1, wherein, in plan view, an area of the output transistor is at least about 3 times greater than an area of the driver transistor.

15. A method of fabricating a packaged power electronic device, the method comprising:
providing a bipolar driver transistor comprising a wide bandgap semiconductor material and having a driver base terminal, a driver collector terminal, and a driver emitter terminal on a substrate; and
providing a bipolar output transistor comprising a wide bandgap semiconductor material and having an output base terminal, an output collector terminal, and an output emitter terminal on the substrate, wherein the output collector terminal is coupled to the driver collector terminal, and wherein the output base terminal is coupled to the driver emitter terminal to provide a Darlington pair,
wherein a blocking voltage of the packaged power electronic device is greater than about 5 kilovolts (kV).

16. The method of claim 15, wherein an area ratio of the area of the output transistor to the area of the driver transistor is between about 3:1 to about 5:1.

17. The method of claim 15, wherein providing the driver and output transistors comprises:
providing the substrate of a first conductivity type, wherein the substrate includes a common collector terminal thereon that provides the driver and output collector terminals;
providing a drift layer of the first conductivity type on the substrate opposite the common collector terminal, the drift layer having a lower carrier concentration than that of the substrate;
providing a base layer of a second conductivity type opposite the first conductivity type on the drift layer opposite the substrate, the base layer comprising a trench therein that defines first and second electrically isolated mesas, the first mesa including the driver base terminal thereon, and the second mesa including the output base terminal thereon; and
providing an emitter layer of the first conductivity type on the base layer opposite the drift layer, the emitter layer comprising first and second electrically isolated portions, the first portion including the driver emitter terminal thereon, and the second portion including the output emitter terminal thereon.

18. The method of claim 17, wherein the substrate comprises a 4H—SiC substrate cut at about 8 degrees off-axis, and wherein providing the drift layer, and the base layer comprises:
epitaxially growing the drift layer of the first conductivity type on the substrate, the drift layer having dopant concentration of about $5 \times 10^{14}$ cm$^{-3}$; and
epitaxially growing the base layer of the second conductivity type on the drift layer, the base layer having a dopant concentration of about $6 \times 10^{17}$ cm$^{-3}$.

19. The method of claim 17, wherein the driver and output emitter terminals comprise ohmic nickel contacts, and wherein the driver and output base terminals comprise ohmic aluminum/titanium contacts.

20. The method of claim 17, wherein providing the base layer and providing the emitter layer comprises:
forming the base layer on the drift layer;
forming the emitter layer on the base layer opposite the drift layer; and
etching through the emitter layer to define the first and second electrically isolated portions thereof and to expose a portion of the base layer; and
etching through the exposed portion of the base layer to provide the trench therein that defines the first and second electrically isolated mesas thereof.

21. The method of claim 17, further comprising:
forming a region of the first conductivity type in the second mesa of the base layer adjacent to the output base terminal, the region of the first conductivity type being electrically connected to the output emitter terminal on the second portion of the emitter layer,
wherein a distance between the region of the first conductivity type and the drift layer is less than a distance between the second portion of the emitter layer and the drift layer to provide a non-destructive avalanche current path within an active area of the device.

22. The method of claim 15, wherein, in plan view, an area of the output transistor is at least about 3 times greater than an area of the driver transistor.

23. A wide bandgap Darlington transistor, comprising:
a first silicon carbide ("SiC") bipolar junction transistor ("BJT") having a first collector, a first emitter and a first base; and
a second SiC BJT having a second collector that is coupled to the first collector and a second emitter that is coupled to the first base and configured to provide a current thereto;
wherein a blocking voltage of the Darlington transistor is greater than about 5 kilovolts (kV).

24. The Darlington transistor of claim 23, further comprising:
a third SiC BJT having a third collector, a third emitter, and a third base connected to the first collector, the first emitter, and the first base, respectively,
wherein an emitter-base p-n junction between the third emitter and the third base of the third SiC BJT is closer to a collector-base p-n junction between the third collector and the third base thereof than are corresponding p-n junctions of the first SiC BJT such that the third SiC BJT provides a non-destructive avalanche current path between the first collector and the first emitter.

25. The Darlington transistor of claim 23, further comprising:
a third SiC BJT having a third collector that is coupled to the first collector, a third emitter that is coupled to a second base of the second SiC BJT and configured to provide a current thereto, and a third base that is configured to be coupled to an external drive circuit.

26. The Darlington transistor of claim 23, wherein an area ratio of the first SiC BJT to the second SiC BJT is between about 3:1 to about 5:1.

* * * * *